United States Patent [19]
Chen et al.

[11] Patent Number: 5,418,066
[45] Date of Patent: May 23, 1995

[54] POLYIMIDE COMPOSITION FOR POLYIMIDE/COPPER FOIL LAMINATE

[75] Inventors: Han L. Chen, Nantou Hsien; Syh-Ming Ho, Hsinchu; Tsung H. Wang, Taichung Hsien; Jing-Pin Pan, Hsinchu, all of Taiwan, Prov. of China

[73] Assignee: Industrial Technology Research Institute, Chutung, Taiwan, Prov. of China

[21] Appl. No.: 198,352

[22] Filed: Feb. 18, 1994

Related U.S. Application Data

[62] Division of Ser. No. 70,537, May 28, 1993, Pat. No. 5,290,909.

[51] Int. Cl.$^6$ ............................................. B32B 15/08
[52] U.S. Cl. ............................... 428/458; 428/473.5
[58] Field of Search ........................... 428/458, 473.5; 427/383.3, 384, 385.5, 388.1, 388.2

[56] References Cited

U.S. PATENT DOCUMENTS

| | | | |
|---|---|---|---|
| 3,247,165 | 4/1966 | Rodia | 528/353 |
| 5,077,084 | 12/1991 | Konotsune et al. | 427/96 |

Primary Examiner—D. S. Nakarani
Attorney, Agent, or Firm—W. Wayne Liauh

[57] ABSTRACT

A polyimide/copper foil laminate prepared using a polyimide composition that does not require an adhesive layer between the polyimide substrate and the copper foil. A polyimide precursor is first prepared from a monomer composition, which comprises a dianhydride and an imidazole-containing or benzimidazole-containing compound, or mixture thereof. The polyimide precursor is then coated onto a copper foil and subsequently subject to an imidization reaction to form a polyimide/copper foil laminate, which exhibits excellent peel strength and flatness while retaining all the advantageous properties that are characteristic of polyimide resins, such as excellent mechanical strength and heat and chemical resistance. Because the polyimide/copper foil laminates disclosed in the present invention are made without the need to apply an ahsesive layer, the process of manufacturing the same is greatly simplified and the cost of production therefor can be substantially reduced. Furthermore, many of the problems caused by the inferior chemical and/or physical properties of the adhesive layer are completely eliminated.

8 Claims, 3 Drawing Sheets

POLYIMIDE COMPOSITION FOR POLYIMIDE/COPPER FOIL LAMINATE

This is a divisional application of application Ser. No. 08/070,537, filed May 28, 1993, now U.S. Pat. No. 5,290,909, issued Mar. 1, 1994.

FIELD OF THE INVENTION

This invention relates to a polyimide composition for preparing a polyimide/copper foil laminate that does not require an adhesive layer. More particularly, this invention relates to a polyimide/copper foil laminate which does not require an adhesive layer to bond the polyimide substrate and the copper foil therebetween, while providing a desired peel strength and the excellent mechanical, chemical and electrical properties that are characteristic of polyimide resins.

BACKGROUND OF THE INVENTION

Polyimide (PI) is known to have excellent thermal stability, low dielectric constant, and high resistance against chemical corrosion. Because of these advantageous properties, polyimide has been widely used in the electronic industry, most notably as a base material, or the so-called substrate, in electronic packaging applications, such as in the manufacturing of tape automated bonding (TAB), flexible printed circuit board (FPC), multichip modules (MCM), etc.

However, in the commercial applications of polyimide, particularly in the areas related to tape automated bonding and flexible circuit board, polyimide lacks the required adhesion to be used alone as a substrate. As a consequence, an adhesive layer is often required between the copper foil and the polyimide substrate to bond the same together. FIG. 1 shows a flowchart diagram describing the process in making the polyimide/adhesive/copper foil laminate.

Because of the extra step required and the relative complexity involved in the process of making the polyimide-/adhesive/copper foil laminate, the cost of manufacturing therefor has become a significant portion in the total cost of making tape automated bonding or flexible printed circuit board. Furthermore, the adhesive layer often does not have the same heat resistance and/or weatherability as the polyimide substrate, thus it often compromise the quality of the polyimide-based substrate. Typical adhesives that have been used in making the polyimide-/adhesive/copper foil laminate include acrylic and epoxy resins. These resins are known to lack thermal resistance and often became bursted during the welding of the laminates.

European patent application EP 0 383 461 A2 discloses a process for producing a flexible printed base by directly coating a copper foil with a polyimide precursor, followed by heating, drying and curing the precursor. The polyimide precursor has repeating units of aromatic tetracarboxylic acid anhydrides, such as 2,3,3',4'-tetracarboxydiphenyl, and aromatic diamines, such as diaminosiloxanediamine. Although the siloxane compound improves the adhesion between the polyimide substrate and the copper foil, it also introduces other problems, such as the lowering of the glass transition temperature, Tg, of the imide copolymer, and the heat resistance thereof. Also, because of some compatibility problems that exist between siloxane and polyimide molecules, phase separations often occur as a result, thus causing adverse effects on the appearance of the final product and the physical properties thereof.

U.S. Pat. No. 3,247,165 (the '165 patent) discloses a polyimide composition formed by the reaction of benzophenone tetracarboxylic acid dianhydride and certain heterocyclic diamines. Examples of heterocyclic diamines include benzimidazole, benzoxazole, benzothiazole, etc. The object of the polyimide compositions disclosed in the '165 patent was to provide improved heat resistance; they are not suitable for use as a base material in the production of polyimide/copper foil laminates to be used in FPC or TAB applications.

SUMMARY OF THE INVENTION

Having discussed the shortcomings of the prior art polyimide substrate and the process in making polyimide/copper foil laminates, the primary object of the present invention is, therefore, to develop an improved polyimide composition that can be directly adhered to copper foil, without the need to use an adhesive layer therebetween.

Another object of the present invention is to develop a polyimide/copper foil laminate for use in electronic packing applications such as tape automated bonding and flexible printed circuit board that exhibits the desired peel strength and excellent flatness, while retaining all the advantageous properties that are characteristic of polyimide resins, such as excellent mechanical strength and heat and chemical resistance.

Because the polyimide/copper toil laminates disclosed in the present invention are made without the need to apply an adhesive layer between the polyimide substrate and the copper foil, the process of manufacturing the same is greatly simplified and the cost of production therefor can be substantially reduced. Furthermore, because the polyimide composition disclosed in the present invention does not require an adhesive layer, the problems caused by the inferior chemical and/or physical properties of the adhesive layer can be completely eliminated.

In the present invention, a polyimide composition is disclosed which is formed by the polymerization reaction involving one or more imidazole- or benzimidazole-containing amine monomers. Preferred examples of the imidazole- or benzimidazole-containing amine monomers for practicing the present invention are represented by the following formulas:

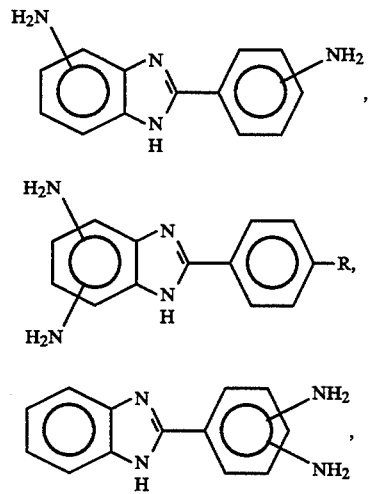

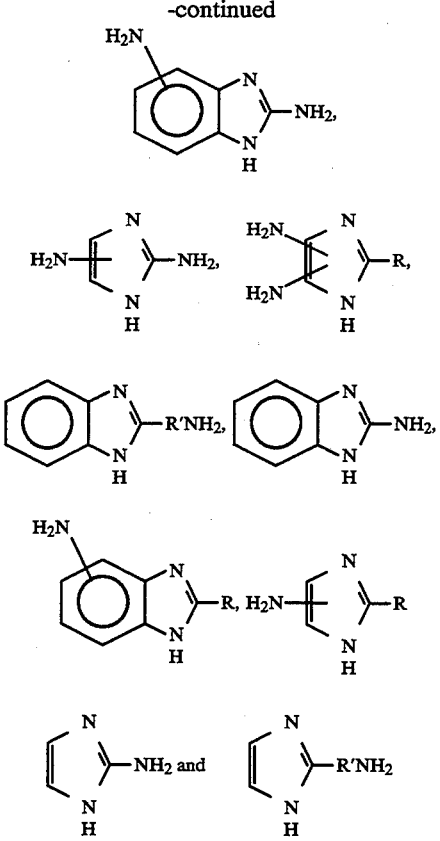

wherein R can be a hydrogen atom, or an alkyl, aryl, or arylalkyl group; and R' can be, independently an alkyl, aryl, or arylalkyl group.

In preparing the polyimide/copper foil laminates disclosed in the present invention, a polyimide precursor, which is polyamic acid, is first prepared by polymerizing one or more of the imidazole-containing monomers described above with a dianhydride. The reaction monomer composition can also comprise a diamine such as oxydianiline and/or phenylene diamine. Then, the polyamic acid is coated on a copper foil, such as an electrolytically deposited copper foil or a rolled copper foil, and subsequently subjected to an imidization reaction at 350° C. and under a nitrogen environment to produce a polyimide/copper foil laminate. FIG. 2 shows the steps involved in preparing the polyimide/copper foil laminates disclosed in the present invention.

The polyimide/copper foil disclosed in the present invention exhibits excellent peel strength, indicating an excellent adhesion between the polyimide substrate and the copper foil. It is postulated that such a strong adhesion is a result of a molecular bonding between the nitrogen atom in the imidazole group and the copper atom. After the polyimide of the present invention is applied onto the surface of the copper foil, the hydrogen atom attached to the nitrogen atom in the heterocyclic ring can be easily released due to the resonance of the imidazole group to form a positively charged hydrogen ion and a negatively charged imidazole radical, in accordance with the following reaction:

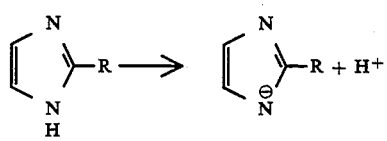

The negatively charged imidazole radical then reacts with a positively charged copper ion to form a complex compound:

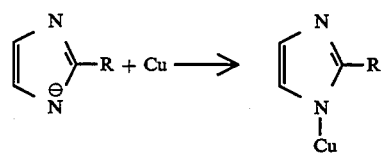

The molecular bonding between the nitrogen atom and the copper atom thus provides an excellent adhesion required by the polyimide/copper foil laminates.

Another advantage of the present invention is that the monomer composition in preparing the polyimide can be adjusted so that the thermal expansion coefficient of the final product matches that of the copper foil. This advantage allows the polyimide/copper foil laminate to exhibit excellent flatness.

DETAILED DESCRIPTION OF THE PREFERRED EMBODIMENTS

The present invention will now be described more specifically with reference to the following examples. It is to be noted that the following descriptions of examples including preferred embodiments of this invention are presented herein for purpose of illustration and description; it is not intended to be exhaustive or to limit the invention to the precise form disclosed.

Example 1

3.3639 g (0.015 mole) of a benzimidazole-containing compound (BIA) having the following formula:

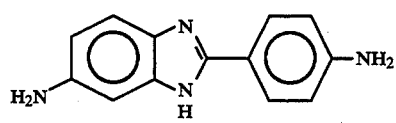

1.6221 g (0.015 mole) of p-phenylene diamine (PDA) having the following formula:

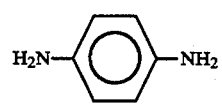

and 4.0048 (0.02 mole) g of 4,4'-oxydianiline (ODA) having the following formula:

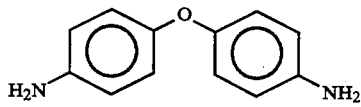

were added to a 500-ml reaction vessel. Thereafter, 140 ml of NMP solvent was added to the reaction vessel and stirred under a nitrogen environment until dissolution. Then 14.5638 g (0.0495 mole) of biphenyl-3,3',4,4'-tetracarboxylic dianhydride (BPDA) having the following formula:

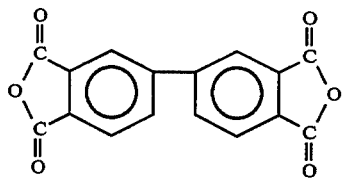

was slowly added and the reaction mixture was stirred for 4 hours. A highly viscous polyamic acid was obtained, and its physical properties were measured. This example represents a reaction mixture which can be described, in terms of the composition and the molar ratio of the monomers, as (BPDA/0.3 PDA, 0.4 ODA, 0.3 BIA).

The polyamic acid was then coated onto a copper foil, which could be an electrolytically deposited copper foil or a rolled copper foil, and was subject to an imidization reaction under nitrogen at 350° C. to form a polyimide/copper foil laminate. The peel strength, which is an indication of the extent of adhesion between the polyimide resin and the copper foil, was measured at a 90° angle.

Figure 1:
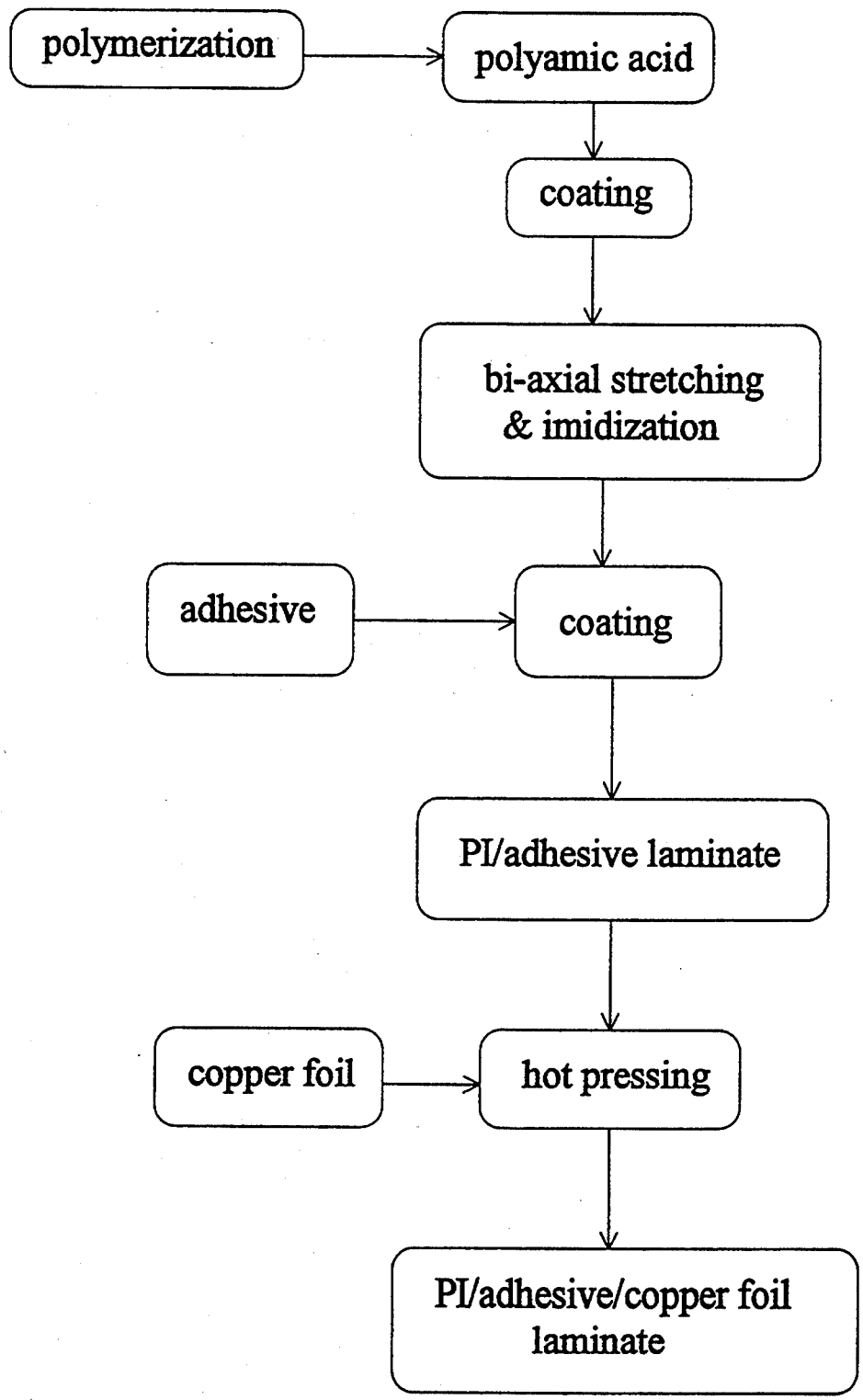
FIG. 1 is a flowchart diagram showing the steps of the prior art process of preparing polyimide/adhesion layer/copper foil laminates.
Figure 2:
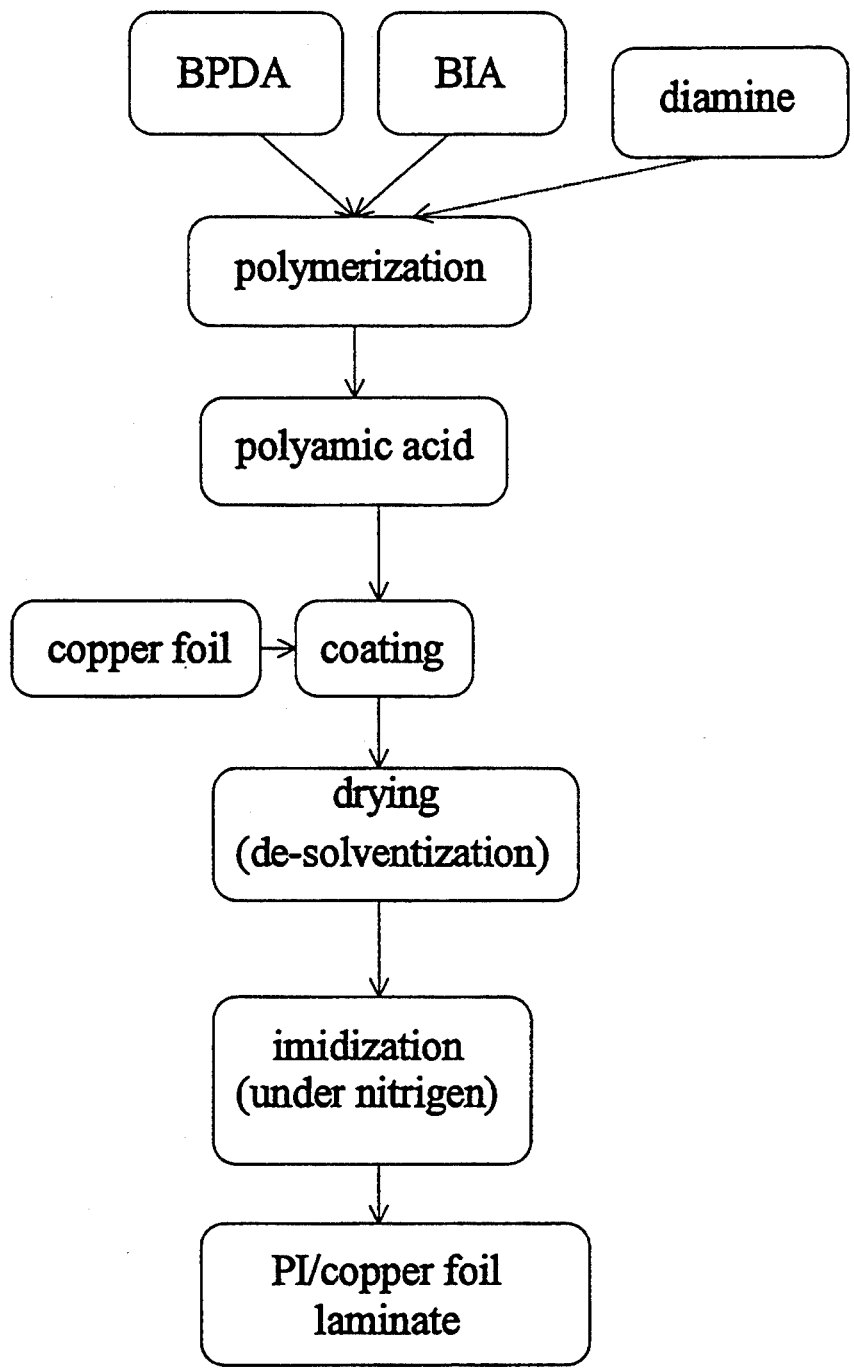
FIG. 2 is a flowchart diagram showing the process of preparing polyimide/copper foil laminates of the present invention.
Figure 3:
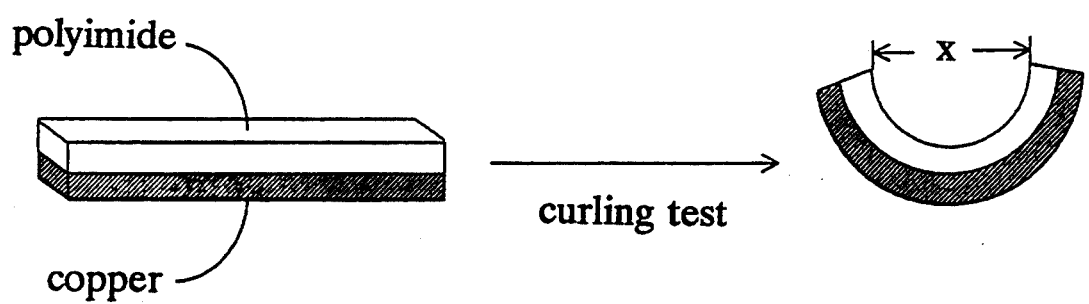
FIG. 3 is a schematic diagram showing how the extent of curling, which is an indication of lack of flatness, is measured.

The laminate was then cut into a long strip having 50 mm length and 5 mm width, and was allowed to fully stretch to measure the extent of curling X, as illustrated in FIG. 3. A smaller value of X indicates a higher extent of curling and a poorer flatness, and is thus less desirable. The flatness of the laminate and the thermal expansion coefficient of the polyimide were measured. It is desirable that the thermal expansion coefficient of the polyimide substrate should be close to that of the copper which is 17.6 ppm/°C.

The peel strength of the polyimide/copper foil laminate of the present invention without an adhesive layer compares favorably with that of commercial polyimide-/adhesive/copper foil laminates, which usually ranges from 7.8 to 10 lb/in. polyimide/copper foil laminate of the present invention also exhibits excellent flatness.

Example 2

6.7278 g (0.03 mole) of the benzimidazole-containing compound as used in Example 1 and 4.0048 (0.02 mole) g of 4,4'-oxydianiline were added to a 500-ml reaction vessel. Thereafter, 140 ml of NMP solvent was added to the reaction vessel and stirred under nitrogen until dissolution. Then 14.5638 g (0.0495 mole) of biphenyl-3,3',4,4'-tetracarboxylic dianhydride was gradually added and the reaction mixture was stirred for 4 hours. A highly viscous polyamic acid was obtained, and its physical properties were measured. This example represents a reaction mixture of (BPDA/0.4 ODA, 0.6 BIA).

The polyamic acid was then coated onto a copper foil and was subject to an imidization reaction under nitrogen at 350° C. to, form a polyimide/copper foil laminate. The peel strength and flatness of the laminate were measured, and the results show that the polyimide/copper foil laminate of the present invention without an adhesive layer shows excellent peel strength and flatness.

Comparative Example 1

10.012 g (0.05 mole) of 4,4'-oxydianiline was added to a 500-ml reaction vessel. Thereafter, 140 ml of NMP solvent was added to the reaction vessel and stirred under nitrogen until dissolution. Then 14.5638 g (0.0495 mole) of biphenyl-3,3',4,4'-tetracarboxylic dianhydride was gradually added and the reaction mixture was stirred for 4 hours. A highly viscous polyamic acid was obtained, and its physical properties were measured. This example represents a reaction mixture of (BPDA/ODA).

The polyamic acid was then coated onto a copper foil and was subject to an imidization reaction under nitrogen at 350° C. to form a polyimide/copper foil laminate. The peel strength and flatness of the laminate were measured. The laminate without the imidazole monomers showed severe curling, and that its peel strength was not as good as the previous examples using the polyimide composition disclosed in the present invention.

Comparative Example 2

2.0024 g (0.01 mole) of 4,4'-oxydianiline and 4.3256 g (0.04 mole) of p-phenylene diamine were added to a 500-ml reaction vessel. Thereafter, 140 ml of NMP solvent was added to the reaction vessel and stirred under nitrogen until dissolution. Then 14.5638 g (0.0495 mole) of biphenyl-3,3',4,4'-tetracarboxylic dianhydride was gradually added and the reaction mixture was stirred for 4 hours. A highly viscous polyamic acid was obtained, and its physical properties were measured. This example represents a reaction mixture of (BPDA/0.8 PDA, 0.2 ODA).

The polyamic acid was then coated onto a copper foil and was subject to an imidization reaction under nitrogen at 350° C. to form a polyimide/copper foil laminate. The peel strength and flatness of the laminate were measured. The test results show that although the laminate in Comparative Example 2, without the imidazole monomers, provided satisfactory flatness, it showed an inferior peel strength relative to the laminates prepared using the polyimide composition of the present invention.

Comparative Example 3

5.006 g (0.025 mole) of 4,4'-oxydianiline and 2.7035 g (0.04 mole) of p-phenylene diamine were added to a 500-ml reaction vessel. Thereafter, 140 ml of NMP solvent was added to the reaction vessel and stirred under nitrogen until dissolution. Then 14.5638 g (0.0495 mole) of biphenyl-3,3',4,4'-tetracarboxylic dianhydride was added and the reaction mixture was stirred for 4 hours. A highly viscous polyamic acid was obtained, and its physical properties were measured. This example represents a reaction mixture of (BPDA/0.5 ODA, 0.5 PDA).

The polyamic acid was then coated onto a copper foil and was subject to an imidization reaction under nitrogen at 350° C. to form a polyimide/copper foil laminate.

The peel strength and flatness of the laminate were measured. The laminate in the Comparative Example 3 exhibited inferior flatness and peel strength relative to the laminates prepared using the polyimide composition of the present invention.

Comparative Example 4

11.213 g (0.05 mole) of the benzimidazole-containing compound as used in Example 1 was added to a 500-ml reaction vessel. Thereafter, 140 ml of NMP solvent was added to the reaction vessel and stirred under nitrogen until dissolution. Then 14.5638 g (0.0495 mole) of biphenyl-3,3',4,4'-tetracarboxylic dianhydride was gradually added and the reaction mixture was stirred for 4 hours. A highly viscous polyamic acid was obtained, and its physical properties were measured. This example represents a reaction mixture of (BPDA/BIA).

The polyamic acid was then coated onto a copper foil and was subject to an imidization reaction under nitrogen at 350° C. to form a polyimide/copper foil laminate. The peel strength and flatness of the laminate were measured. The test results show that the amount of the imidazole- or benzimidazole-containing compounds can be adjusted so that the thermal expansion coefficient of the polyimide substrate matches that of the copper foil, so as to allow the final polyimide/copper foil laminates to maintain tile desired flatness.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A polyimide/copper foil laminate comprising a polyimide coated onto a copper foil, said polyimide being prepared from a monomer composition comprising:
    (a) a dianhydride;
    (b) an imidazole-containing or benzimidazole-containing compound, or mixture thereof, and
    (c) and oxydianiline.

2. The polyimide/copper foil laminate of claim 1 wherein said imidazole-containing or benzimidazole-containing compound is selected from the group consisting of the molecules repreprensented by the following formula:

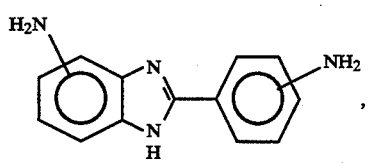

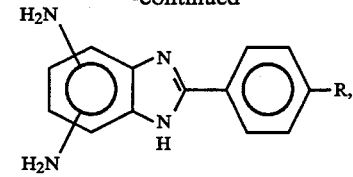

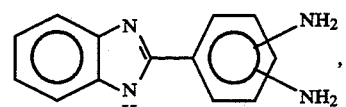

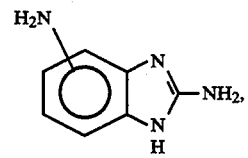

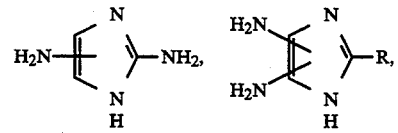

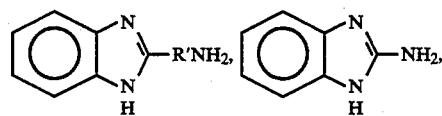

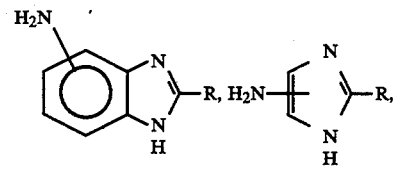

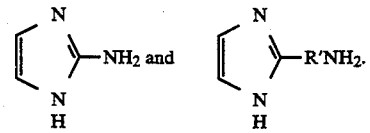

wherein R and R' are, independently, an alkyl, aryl, or arylakyl group.

3. The polyimide/copper foil laminate of claim 1 wherein said dianhydride is biphenyl-3,3',4,4'-tetracarboxylic dianhydride.

4. The polyimide/copper foil laminate of claim 1 wherein said oxydianiline is 4,4'-oxydianiline.

5. The polyimide/copper foil laminate of claim 1 wherein said monomer composition further comprises p-phenylene diamine.

6. The polyimide/copper foil laminate of claim 1 wherein said imidazole-containing or benzimidazole-containing compound constitutes about 1 to 70 mol % of the total monomer composition.

7. The polyimide/copper foil laminate of claim 1 wherein said imidazole-containing or benzimidazole-containing compound constitutes about 15 to 50 mol % of the total monomer composition.

8. The polyimide/copper foil laminate of claim 1 wherein said imidazole-containing or benzimidazole-containing compound is represented by the following formula:

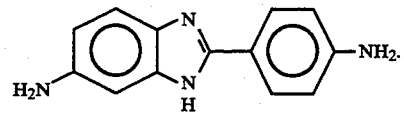

* * * * *